(12) United States Patent
Hu et al.

(10) Patent No.: US 6,780,566 B2
(45) Date of Patent: *Aug. 24, 2004

(54) HIGH PERFORMANCE, PHOTOIMAGEABLE RESIN COMPOSITIONS AND PRINTING PLATES PREPARED THEREFROM

(75) Inventors: Yuxin Hu, San Diego, CA (US); David H. Roberts, Carlsbad, CA (US); Reny R. Paguio, Murrietta, CA (US); Maria Teresa A. Castillo, San Diego, CA (US)

(73) Assignee: Napp Systems, Inc., San Marcos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/386,315

(22) Filed: Mar. 11, 2003

(65) Prior Publication Data

US 2003/0175622 A1 Sep. 18, 2003

Related U.S. Application Data

(62) Division of application No. 09/823,904, filed on Mar. 30, 2001, now Pat. No. 6,579,664.

(51) Int. Cl.[7] .................. G03F 7/027; G03F 7/028; G03F 7/033
(52) U.S. Cl. .............. 430/284.1; 430/306; 522/95
(58) Field of Search ................ 430/284.1, 283.1, 430/285.1, 286.1, 287.1, 306; 522/95, 100, 102, 103

(56) References Cited

U.S. PATENT DOCUMENTS

| | | |
|---|---|---|
| 3,046,127 A | 7/1962 | Barney et al. |
| 3,697,280 A | 10/1972 | Strilko |
| 4,410,621 A | 10/1983 | Wada et al. |
| 4,694,049 A * | 9/1987 | Morita et al. ............... 525/440 |
| 4,716,094 A * | 12/1987 | Minonishi et al. ....... 430/284.1 |
| 5,073,477 A | 12/1991 | Kusuda et al. |
| 5,410,060 A | 4/1995 | Schroeder et al. |
| 5,475,038 A | 12/1995 | Skoultchi |
| 5,573,889 A | 11/1996 | Hofmann et al. |
| 5,731,129 A | 3/1998 | Koshimura et al. |
| 5,736,298 A | 4/1998 | Koshimura et al. |
| 5,861,232 A | 1/1999 | Kanda et al. |
| 5,976,763 A | 11/1999 | Roberts et al. |
| 6,242,149 B1 | 6/2001 | Maeda |
| 6,280,905 B1 | 8/2001 | Koshimura et al. |

FOREIGN PATENT DOCUMENTS

WO    WO 99/20708    4/1999

* cited by examiner

Primary Examiner—Cynthia Hamilton
(74) Attorney, Agent, or Firm—Carmody & Torrance LLP

(57) ABSTRACT

In accordance with the present invention, there are provided high performance, photoimageable resin compositions for flexographic printing, having excellent physical properties, e.g., resilience, hardness, toughness, and the like, as well as increased rates of cure upon exposure to radiation. In a further aspect of the invention, there are provided printing plates prepared employing invention compositions, wherein said printing plates are characterized as having excellent exposure sensitivity, the capability of rapidly curing upon exposure, excellent retention of fine details, and excellent colorless performance. Moreover, printing plates prepared employing invention compositions have good flexibility, excellent washout properties, and retain such properties over extended periods of storage. In another aspect of the invention, there are provided methods for the preparation of formulations comprising said compositions and methods for use thereof.

12 Claims, No Drawings

HIGH PERFORMANCE, PHOTOIMAGEABLE RESIN COMPOSITIONS AND PRINTING PLATES PREPARED THEREFROM

CROSS REFERENCE TO RELATED APPLICATIONS

This application is a divisional of pending application Ser. No. 09/823,904, filed Mar. 30, 2000, now U.S. Pat. No. 6,579,664.

FIELD OF THE INVENTION

The present invention relates to high performance, photoimageable resin compositions useful for the manufacture of printing plates. In particular, the present invention relates to compositions which exhibit excellent processing characteristics when deposited on a printing plate, e.g., exceptional physical properties, high rate of cure upon exposure to radiation, high resolution, and the like. In accordance with another aspect, the present invention relates to methods for the preparation of formulations comprising invention compositions and methods for use thereof.

BACKGROUND OF THE INVENTION

Flexographic printing is widely used in the production of newspapers and in the decorative printing of packaging media. In flexographic printing, a layer of a flexible printing medium is deposited onto a flexible substrate such as a thin sheet of steel, aluminum, or synthetic polymer, to form a printing plate. A relief pattern corresponding to the negative image to be printed is formed in the printing medium. The plate is then mounted on the printing press, and printing commences.

One type of printing medium is natural or synthetic rubber. This printing medium has excellent mechanical properties, but the preparation of a printing plate with a rubber printing medium is slow and of low quality. For molded rubber plates, a pattern plate and a matrix board are prepared, and rubber plates are then hot press molded. Molded rubber printing media are not practical for printing applications with short deadlines, such as newspapers. Due to the nature of the medium and imaging techniques described above, photosensitive printing plates have been developed to meet the demand for fast, higher resolutions and long press runs.

The use of a photosensitive printing medium for the manufacture of flexographic printing plates is described in general terms as follows. The photosensitive printing material is coated onto the substrate to form the printing plate. The coated side is exposed with light through a photographic negative of the image to be printed, causing photopolymerization of the exposed portion of the printing medium, which then becomes physically hardened and resistant to solvent removal. The unexposed and therefore unhardened portion of the printing medium is removed by washing with solvent, leaving a relief pattern of the image to be printed. The printing plate is mounted on a press and printing commences.

Non-flexographic printing plates such as letterpress plates are also used for printing newspapers, shoppers, and books. Photosensitive resin compositions have been developed for use with non-flexographic printing applications for the same reasons disclosed above for flexographic applications. The use of photosensitive printing media for the manufacture of letterpress printing plates is essentially the same as described above for flexographic printing applications.

Photosensitive resin compositions currently employed for the preparation of photosensitive resin plates can be based on unsaturated polyesters, polyvinyl alcohols, polyamides, cellulose acetate succinates, polydiene polymers and their copolymers, urethanes, etc. Currently available photosensitive resin compositions are adequate in the manufacture of flexible printing plates. However, due to the rapid growth of the printing industry, there is an ever-increasing demand for photosensitive resin compositions with improved performance and processing characteristics. The resin composition must maintain a good balance between mechanical properties such as resilience, hardness and toughness. Additionally, in order to increase manufacturing efficiency, the resin will desirably exhibit reduced tack for ease of handling before photopolymerization and will also desirably photopolymerize as quickly as possible when exposed to the photoinitiation source.

Accordingly, there remains a need in the art for photosensitive resin compositions having improved chemical and physical properties. The present invention fulfills this need and further provides related advantages.

SUMMARY OF THE INVENTION

In accordance with the present invention, there are provided high performance, photoimageable resin compositions having excellent physical properties, e.g., resilience, hardness, toughness, and the like, as well as high rates of cure upon exposure to radiation. In a further aspect of the invention, there are provided printing plates prepared employing invention compositions, wherein said printing plates are characterized as having excellent exposure sensitivity, the capability of rapidly curing upon exposure, excellent retention of fine details, excellent colorless performance (i.e., provides high quality color printing), and the like. Moreover, printing plates prepared employing invention compositions have good flexibility, excellent washout properties, and retain such properties over extended periods of storage. In another aspect of the invention, there are provided methods for the preparation of formulations comprising said compositions and methods for use thereof.

A desirable characteristic of any printing medium is developability in water, rather than organic solvents. Water-developable compositions are desirable for such reasons as ease of handling, health of workers who are in contact therewith, safety, and avoidance of environmental pollution. Therefore, in accordance with a particular aspect of the invention there are provided water-developable formulations comprising invention compositions with improved physical properties and increased rates of cure upon exposure to radiation.

Additionally, due to the improved physical properties provided by invention compositions, printing plates prepared employing such compositions have excellent form stability, thereby enabling such plates to be handled without the need for excessive care. Once photopolymerized, invention printing plates have excellent physical properties, enabling their use in many very demanding commercial applications, e.g., publication printing, and other long-run applications. Such applications require the photopolymerized resin to have excellent water resistance (so that exposure to water-based inks does not significantly alter resin properties), as well as good resilience (so that the physical contacting associated with the printing process does not significantly degrade resin properties). Photopolymerized compositions of the invention maintain a good balance between toughness, resilience, and hardness. Photopolymerization of invention compositions yields products with ink transfer characteristics considered very good by flexographic printing standards and demonstrates sufficient toughness for extended printing runs as required in such areas as directory, newspapers, and pre-printed inserts. In addition, the increased image resolution provided by invention compositions leads to printing plates with higher print quality.

DETAILED DESCRIPTION OF THE INVENTION

In accordance with the present invention, there are provided high performance, photoimageable resin compositions comprising:

(I) in the range of 20 up to about 75 wt % of at least one copolymer comprising in the range of:
  (i) about 5 up to about 95 mol % of at least one aliphatic conjugated diene monomer,
  (ii) about 1 up to about 30 mol % of at least one $\alpha,\beta$-ethylenically unsaturated carboxylic acid, sulfonic acid, phosphonic acid, amine, or ammonium,
  (iii) about 0.1 up to about 10 mol % of at least one polyfunctional vinyl monomer,
  (iv) 0 up to about 70 mol % of at least one monofunctional vinyl monomer, and
  (v) in the range of 0 up to about 50 mol % of at least one emulsifier (surfactant) per mol of free carboxyl, sulfonyl, phosphonyl, ammonium, or amine, or alkoxylated derivative thereof;

(II) in the range of 0 up to about 40 wt % of a linear thermoplastic, elastomeric polymer of formula B, or block copolymer having at least one unit of the general formula (A-B), (A-B)$_n$, or (A-B-A), wherein A is a non-elastomeric polymer block having a number average molecular weight in the range of about 2,000 up to about 100,000 and a glass transition temperature above about 25° C., and B is an elastomeric polymer or polymer block having a number average molecular weight in the range of about 25,000 to about 1,000,000 and glass transition temperature below about 10° C., (III) in the range of 0 to about 20 wt % of a (meth)acrylate terminated urethane oligomer having molecular weight from 2000 to about 100,000 having the structure:

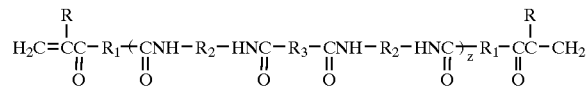

wherein:
each R is independently —H or methyl,
each R$_1$ is independently straight or branched chain lower alkylene, oxyalkylene, alkenylene, and/or oxyalkylene,
each R$_2$ is independently straight or branched chain alkylene, cycloalkylene, arylene, or alkylarylene,
each R$_3$ is independently straight or branched chain alkylene, oxyalkylene, alkenylene, and/or oxyalkylene, and
z is 1 to about 100;

(IV) in the range of 0 up to about 20 wt % of at least one monofunctional, ethylenically unsaturated monomer having the structure:

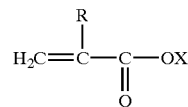

wherein:
R is —H or methyl, and
X is an alkyl group having in the range of about 4 up to about 40 carbon atoms, (V) in the range of 2 to about 25 wt % of at least one polyfunctional, ethylenically unsaturated monomer having the core structure:

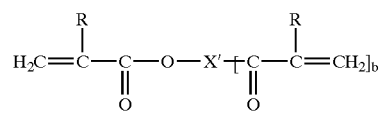

wherein: R is as defined above and X' is selected from:
  (i) alkylene or substituted alkylene having in the range of 1 up to about 50 carbon atoms, and b is 1,
  (ii) oxyalkylene or substituted oxyalkylene having in the range of 1 up to about 150 carbon atoms, and b is 1,
  (iii) a polyvalent alkylene or oxyalkylene moiety, wherein b is 2, 3 or 4,
  (iv) a bisphenolyl moiety;

(VI) in the range of 5 to about 35 wt % of a basic nitrogen-containing compound, (VII) in the range of 0 to about 20 wt % of at least one plasticizer having carboxyl, sulfonyl, phosphonyl, ammonium, or amine groups, or alkoxylated derivatives thereof, having from 5 to about 500 carbon atoms, or a mixture of any two or more thereof, (VIII) in the range of 0 to about 5 wt % of a chain transfer agent, (IX) in the range of about 0.01 to about 10 wt % of a photopolymerization initiation system, and (X) in the range of 0 to about 5 wt % of a tack reducing agent, with the proviso that (III) or (VIII) is present in the composition.

Copolymers contemplated for use in the practice of the present invention (i.e., component (I)) are prepared from a combination of several components, e.g., an aliphatic conjugated diene monomer, an $\alpha,\beta$-ethylenically unsaturated carboxylic acid, sulfonic acid, phosphonic acid, amine, or ammonium, a polyfunctional vinyl monomer, optionally a monofunctional vinyl monomer, and optionally at least one emulsifier or surfactant. Typically, such compositions comprise in the range of about:

(i) 5 to about 95 mol % of an aliphatic conjugated diene monomer, (ii) 1 to about 30 mol % of an $\alpha,\beta$-ethylenically unsaturated carboxylic acid, sulfonic acid, phosphonic acid, amine, or ammonium, (iii) 0.1 to about 10 mol % of a polyfunctional vinyl monomer, (iv) 0 to about 70 mol % of a monofunctional vinyl monomer.

(v) 0 to about 50 mol % of at least one emulsifier or surfactant.

Preferred copolymer compositions employed in the practice of the present invention comprise in the range of
  (i) 40 to about 90 mol % of an aliphatic conjugated diene monomer,
  (ii) 2.5 to about 15 mol % of an α,β-ethylenically unsaturated carboxylic acid, sulfonic acid, phosphonic acid, amine, or ammonium,
  (iii) 0.5 to about 5 mol % of a polyfunctional vinyl monomer,
  (iv) 5 to about 30 mol % of a monofunctional vinyl monomer, and
  (v) 0.5 to about 10 mol % of an emulsifier or surfactant.

Aliphatic conjugated diene monomers contemplated for use in the practice of the present invention as part of component (I) optionally bear substituents such as lower alkyl or halo, and include, for example, butadiene, isoprene, chloroprene, dimethylbutadiene, and the like. Presently preferred aliphatic conjugated diene monomers include butadiene and isoprene.

α,β-ethylenically unsaturated carboxylic acids, sulfonic acids, phosphonic acids (or salts thereof), amines, ammoniums, or alkoxylated derivatives thereof contemplated for use in the practice of the present invention as part of component (I) include (meth)acrylic acid, itaconic acid, maleic acid, carboxyethyl (meth)acrylate, 2-(meth) acryloyloxyethylsuccinate, 2-(meth)acryloyloxyethylhexahydrophthalate, styrene sulfonic acid, 2-acrylamido-2-methyl propyl sulfonic acid, 2-acrylamido-N-methylpropane sulfonic acid, N,N-diallyl-N-alkyl ammonium propanyl sulfonic acid, 3-allyloxy-2-hydroxypropyl sulfonic acid, 1-allyloxy-2-hydroxypropyl sulfonic acid, allyl alkoxy sulfonic acid, 2-(meth)acryloyloxyethyl phosphate, bis-2-(meth)acryloyloxyethyl phosphate, dimethylaminoethyl (meth)acrylate, dimethylaminoethyl (meth)acrylate, diethylaminoethyl (meth)acrylate, ethyl-3-dimethylamino (meth)acrylate, 3-dimethylamino neopentyl (meth)acrylate, dimethylaminopropyl (meth)acrylamide, N-(meth)acrylate-N'-methyl piperazine, trimethylammonium ethyl (meth)acrylate salt, triethylainmonium ethyl (meth)acrylate salt, ethyl-3-trimethylammonium (meth) acrylate salt, 3-trimethylammonium neopentyl (meth) acrylate salt, trimethylammonium propyl (meth)acrylamide salt, N-(meth)acryl-N'-dimethyl piperazine salt, and the like.

Presently preferred α,β-ethylenically unsaturated carboxylic acids include (meth)acrylic acid and carboxyethyl (meth)acrylate, styrene sulfonic acid, 2-acrylamido-2-methyl propyl sulfonic acid, 2-acrylamido-N-methylpropane sulfonic acid, 2-(meth)acryloyloxyethyl phosphate, triethylammonium ethyl acrylate salt, and the like.

Polyfunctional vinyl monomers contemplated for use in the practice of the present invention as part of component (I) include monomers which have two or more crosslinkable ethylenically unsaturated moieties such as, for example, ethyleneglycol di(meth)acrylate, 1,6-hexanediol di(meth) acrylate, 1,4-butanediol di(meth)acrylate, trimethylol propane tri(meth)acrylate, divinyl benzene, and the like. Presently preferred polyfunctional vinyl monomers include ethyleneglycol di(meth)acrylate and divinyl benzene.

Monofunctional vinyl monomers contemplated for optional use in the practice of the present invention as part of component (I) include monomers which have one crosslinkable ethylenically unsaturated moiety and include, for example, ethyl (meth)acrylate, methyl (meth)acrylate, isopropyl (meth)acrylate, lauryl (meth)acrylate, hydroxyethyl (meth)acrylate, β-carboxyethyl (meth)acrylate, dimethylaminopropyl (meth)acrylate, diethylaminopropyl (meth)acrylate, dimethylaminopropyl (meth)acrylamide, diethylaminopropyl (meth)acrylamide, α-methyl styrene, styrene, and the like, as well as mixtures of any two or more thereof. Presently preferred monofunctional vinyl monomers include methyl methacrylate and styrene.

Emulsifiers contemplated for optional use in the practice of the present invention as part of component (I) include polyvinyl alcohol, water dispersible starch, ionic surfactants having sulfonic or phosphonic moieties, anionic surfactants having quaternary ammonium moieties, and the like. Presently preferred emulsifiers contemplated for use in the practice of the present invention include sulfonic surfactants, quaternary ammonium surfactants, and the like.

Thermoplastic elastomeric polymers of formula B contemplated for optional use in the practice of the present invention (i.e., component (II)) include, for example, polybutadienes, polyisoprenes, polyisobutylenes, polychloroprenes, and the like. Presently preferred thermoplastic elastomeric polymers include polybutadienes such as, for example, 1,2-polybutadiene (cis-, trans-, or mixtures thereof), 1,4-polybutadiene (cis-, trans-, or mixtures thereof), maleic anhydride adducts of polybutadiene, which may then be modified via standard ring-opening techniques and subsequent (half) esterification or (half) amidation, and the like. Particularly preferred polybutadiene used in the practice of the present invention is cis-1,2-polybutadiene. Thermoplastic elastomeric block copolymers contemplated for use in the practice of the present invention have at least one unit of the general formula (A-B), (A-B)$_n$, or (A-B-A), wherein A is a non-elastomeric polymer block and B is the elastomeric polymer block. The non-elastomeric polymer block A is preferably the polymerization product of aromatic hydrocarbons containing vinyl unsaturation. Presently preferred block copolymers include polystyrene-polybutadiene-polystyrene block copolymer, polystyrene-polyisoprene-polystyrene block copolymer, polystyrene-polychloroprene-polystyrene block copolymer, and the like.

Invention compositions may also comprise (meth)acrylate terminated urethane oligomers (i.e., component (III)). Urethane oligomers contemplated for optional use in the practice of the present invention have more than one site of α,β-ethylenic unsaturation. Such compounds include aliphatic or aromatic urethane di(meth)acrylates having the structure (U):

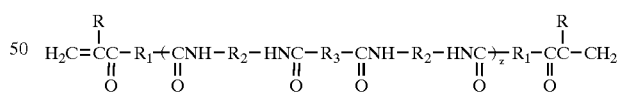

(U)

wherein:
  each R is independently —H or methyl,
  each $R_1$ is independently straight or branched chain lower alkylene, oxyalkylene, alkenylene, or oxyalkylene,
  each $R_2$ is independently straight or branched chain alkylene, cycloalkylene, arylene, or alkylarylene,
  each $R_3$ is independently straight or branched chain alkylene, oxyalkylene, alkenylene, or oxyalkylene, and
  z is 0 to about 100.

Particularly preferred aliphatic urethane di(meth) acrylates, when optionally included in invention compositions, have the structure (U), wherein:

$R_1$ is independently one or more of:

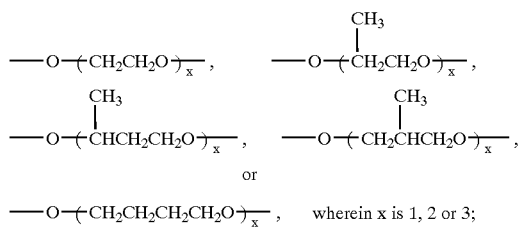

wherein x is 1, 2 or 3;

$R_2$ is independently one or more of:

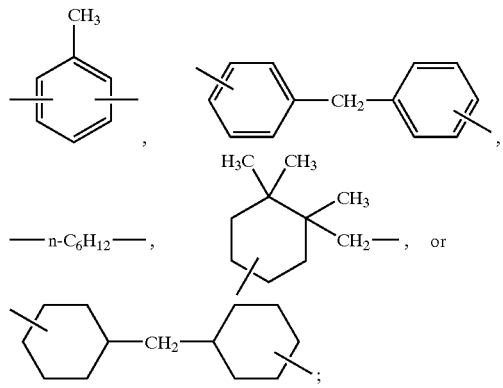

$R_3$ is independently one or more of:

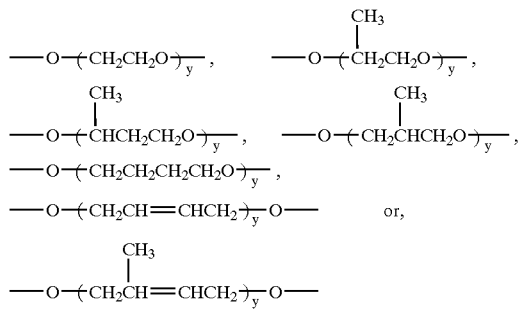

wherein y is 1–50.

Monofunctional ethylenically unsaturated monomers having a (meth)acrylate core structure contemplated for optional use in the practice of the present invention as component (IV) contain one (meth)acrylate moiety and include, for example, caprylyl (meth)acrylate, capryl (meth)acrylate, lauryl (meth)acrylate, myristyl (meth)acrylate, palmityl (meth)acrylate, stearyl (meth)acrylate, oleyl (meth)acrylate, or alkoxylated derivatives thereof, and the like.

Polyfunctional ethylenically unsaturated monomers contemplated for use in the practice of the present invention as component (V) have more than one site of α,β-ethylenic unsaturation, and include such compounds as, for example, diethylene glycol di(meth)acrylate, triethylene glycol di(meth)acrylate, tetraethylene glycol di(meth)acrylate, neopentyl glycol di(meth)acrylate, glycerol di(meth)acrylate, ethoxylated (or propoxylated) bisphenol A di(meth)acrylate, epoxy (methyl)acrylates of glycols, ethoxylated (or propoxylated) trimethylolpropane tri(meth)acrylate, ethoxylated (or propoxylated) glyceryl tri(meth)acrylate, tri(2-hydroxy ethyl) isocyanurate tri(meth)acrylate, ethoxylated (or propoxylated) pentaerythritol tetra(meth)acrylate, penta (meth)acrylate ester, ethoxylated (or propoxylated) dipentaerythritol penta(meth)acrylate and the like. Preferred polyfunctional ethylenically unsaturated monomers have the following structure:

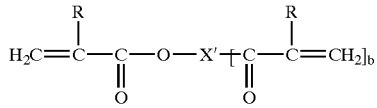

wherein R is as defined above and X' is selected from:

(i) alkylene or substituted alkylene having in the range of 1 up to about 50 carbon atoms, and b is 1, or (ii) oxyalkylene or substituted oxyalkylene having in the range of 1 up to about 200 carbon atoms, and b is 1, or (iii) a polyvalent alkylene or oxyalkylene moiety, wherein b is 2, 3 or 4, and (iv) a bisphenolyl moiety.

Presently preferred polyfunctional ethylenically unsaturated monomers are (meth)acrylate terminated polytetrahydrofurans having the following structure:

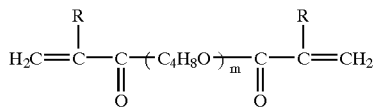

wherein
R is —H or methyl and
m is from 1 to about 50.

Basic nitrogen-containing compounds contemplated for use in the practice of the present invention, (i.e. as component (VI) include, for example, N,N-dimethylaminopropyl (meth)acrylamide, N,N-di methylaminoethyl (meth)acrylate, N,N-dimethylaminoethyl (meth)acrylamide, 3-di methylamino neopentyl (meth)acrylate, ethyl-3-dimethylamino (meth)acrylate, N-(meth)acrylate-N'-methyl piperazine, N-(meth)acrylate-N'-methyl piperazine, N,N-dimethyldodecylamine, N,N-dimethylamino-propylamine, N,N-dimethyltoluidine, triphenylamine, diethylumine, triethylamine, N,N-diethyl-aminoethanol, N,N-dimethylamino propanol, N,N-dimethylamino-propylamine, C-2-alkyldimethylamine, C-8-alkyldimethyl-amine, N,N-dimethylamino-ethylmethacrylate (Ageflex FM2), N-(N,N-dimethylamino)-propyl-2-pyrrolidone 1,3-bis (dimethylamino)propane, 1,6-bis-(dimethylamino)hexane, tetramethyl bis(aminoethyl)ether, pentamethyldiethyleneamine, triethanolamine, pentamethyldipropyleneamine, N',N'-dimethylaminoethyl morpholine, CN386 (a tradename of a reactive amine manufactured by Sartomer Co.), and the like.

Basic nitrogen-containing compounds contemplated for use in the practice of the present invention may also have any one of the following structures:

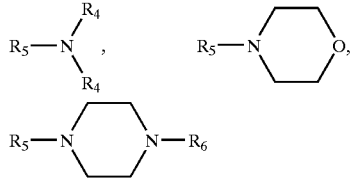

wherein:

R$_4$ is a straight or branched chain alkyl having from 1 to about 4 carbon atoms, each of R$_5$ and R$_6$ are independently alkyl, alkenyl, oxyalkyl, or oxyalkenyl, or alkoxylated or carboxylated derivatives thereof, or (meth)acrylated derivatives thereof, having from 1 to about 100 carbon atoms.

Basic compounds contemplated for optional use in the practice of the present invention may also include alkali metal hydroxides, alkali metal carbonates, alkali metal salts of an organic acids, and the like.

Invention compositions may also optionally contain a plasticizer (i.e., component (VII)), which acts to reduce the glass transition temperature of the polymer, thereby easing proccessability of the composition. Examples of plasticizers useful in the practice of the present invention include carboxyl, sulfonyl, phosphonyl, ammonium, or amine surfactants, or alkoxylated derivatives thereof, or a mixture of any two or more thereof.

Presently preferred plasticizers contemplated for optional use in the practice of the present invention, include, for example, N,N-bis-hydroxyethyl-9,12-octadecadienamide (Scher Chem. Schercomid SLF), N-(2-hydroxypropyl)-9-octadecenamide (Scher Chem. Schercomid OMI), N,N-bis (2-hydroxyethyl)-dodecanamide (Scher Chem. Schercomid SL), ethoxylated or propoxylated phenols, ethoxylated or propoxylated nonylphenols, glycerin, ethoxylated glycerin, octylphenoxypoly-ethoxyethanol(Union carbide, Triton X-series), C$_6$–C$_{18}$ tert-alkyl ethoxylated amine (Union carbide, Triton RW-series), and the like. It is of note that basic nitrogen-containing compounds may serve a dual purpose in the formulations of the present invention, i.e., as components (VI) and (VII). However, when basic nitrogen-containing compounds function in this dual role, they will comprise no greater than 35 wt % of the total formulation.

Chain transfer agents may also be optionally included in invention formulations (i.e., component (VIII)). Chain transfer agents contemplated for optional use in the practice of the present invention comprise compounds having at least one sulfur atom and include, for example, mono-, di-, tri-, and tetra-thiols, sulfides, disulfides, and the like. Presently preferred monothiols are glycerol monothioglycolate, isooctyl 3-mercaptopropionate, or octadecyl 3-mercaptopropionate. A presently preferred dithiol is glycol dimercaptopropionate. A presently preferred trithiol is trimethylolpropane tri-(3-mercaptopropionate). A presently preferred tetrathiol is pentaerythritol tetra-(3-mercaptopropionate). Presently preferred sulfides are dilauryl thiodipropionate or dimethyl thiodipropionate. A presently preferred disulfide is dithio-bis(stearyl propionate).

Photopolymerization initiation systems contemplated for use in the practice of the present invention (i.e., component (IX)) optionally include a phosphorus-containing photoinitiator and, optionally one or more non-phosphorus-containing photoinitiators.

Preferred phosphorus-containing photoinitiators are 2,6-dimethoxybenzoyl phenylphosphinate, 2,6-dimethylbenzoyl diphenylphosphine oxide, 2,4,6-trimethylbenzoyl diphenylphosphine oxide, bis(2,6-dimethoxybenzoyl)-2,4,4-trimethylpentyl phosphine oxide, or ethyl 2,4,6-trimethylbenzoylphenylphosphinate. Preferred non-phosphorus-containing photoinitiators are xanthone, thioxanthone, 2-chloroxanthone, benzil, benzil dimethyl ketal, benzophenone, 4,4'bis(N,N'-dimethylamino) benzophenone, 9,10-anthraquinone, camphorquinone, 9,10-phenanthrenequinone, 2-ethyl anthraquinone, 1,4-naphthoquinone, oligo[2-hydroxy-2-methyl-1-[4-(1-methylvinyl)phenyl] propanone], β-diketone compounds or monoketal derivatives thereof, acyloins or acyloin ethers, hydroxyalkyl acetophenones, or a mixture of any two or more thereof. Most preferred non-phosphorus-containing photoinitiators are benzil dimethyl ketal, 2-ethyl anthraquinone, and camphorquinone.

The initiator is typically added in an amount of 0.01 to 10 parts by weight, preferably 0.5 to 5 parts by weight, per 100 parts by weight of the copolymer. Presently preferred initiators include benzil dimethyl ketal, 2-ethyl anthraquinone, or mixtures thereof.

Compositions contemplated for use in the practice of the present invention optionally further comprise metal-containing additives (i.e., component (X)) comprising coordination complexes of the formula $M^{+n}(Q)_m$, wherein M is a metal, n and m are integers from 1 to 4, and Q is an anionic ligand. The anionic ligand, Q, has the following structure:

$$(E-X)_y-R$$

wherein:

E is NR$_a$, PR$_a$, O, or S, wherein R$_a$ is —H, optionally substituted C$_1$ to C$_{20}$ alkyl, or optionally substituted aryl, X is optional and if present, is carbonyl, thiocarbonyl, SO$_2$, or imine, R is —H, optionally substituted C$_1$–C$_{20}$ alkyl or alkenyl, or optionally substituted aryl, and y is 1, 2, or 3.

Coordination complexes contemplated for use in the practice of the present invention include complexes of transition metals such as Mn, Re, Fe, Ru, Os, Co, Rh, Ir, Ni, Pd, Pt, and the like. Presently preferred transition metals contemplated for use herein include Mn, Fe, Co, and Ni. Particularly preferred transition metals are Mn and Fe.

Coordination complexes contemplated for use in the practice of the present invention also include main group metals such as Cu, Ag, Au, Zn, Al, Ca, Mg, and the like. Presently preferred main group metals contemplated for use herein include Al, Zn, and Cu.

Coordination complexes contemplated for use in the practice of the present invention may contain a wide variety of ligands. In one embodiment the ligands contain oxygen. In a presently preferred embodiment, the anionic ligand is an acetylacetonate (acac). In another presently preferred embodiment, the anionic ligand is a carboxylate, such as acetate. In a particularly preferred embodiment, the ligand is an acrylate. Other ligands contemplated for use in the practice of the present invention include sulfur-based ligands such as sulfonates.

Formulations comprising invention compositions are prepared by using conventional mixing and milling techniques well known in the art. For example, the formulation components can be compounded using a mixer, kneader, or extruder. The components may be combined at the start of the compounding process, or alternatively, one or more of the liquid components may be preabsorbed into any of the solid components before compounding. The resulting formulations can be formed into a photosensitive medium element by forming into a sheet by molding, calendaring, rolling, extruding, or a similar process.

Presently preferred formulations contemplated for use in the practice of the present invention comprise about 20 to 60 wt % of the copolymer (I), about 5 to 35 wt % of polymer (II), about 3 to 15 wt % of the (meth)acrylate terminated urethane oligomers (III), about 0 to 10 wt % of the monofunctional unsaturated monomer (IV), about 3 to 15 wt % of the polyfunctional unsaturated monomer (V), about 5 to 25 wt % of basic nitrogen-containing compound (VI), about 4 to 15 wt % of washout aid (VII), about 0.05 to 2.5 wt % of chain transfer agent (VIII), about 0.05 to 5 wt % of the photopolymerization initiator (IX), and about 0.05 to 4 wt % of the metal-containing additive (X).

Most preferred formulations contemplated for use in the practice of the present invention comprise about 30 to 60 wt % of the copolymer (I), about 7 to 30 wt % of polymer (II), about 3 to 15 wt % of the (meth)acrylate terminated urethane oligomers (III), about 4 to 7 wt % of the monofunctional unsaturated monomer (IV), about 4 to 10 wt % of the polyfunctional unsaturated monomer (V), about 10 to 20 wt % of basic nitrogen-containing compound (VI), about 4 to 10 wt % of washout aid (VII), about 0. 1 to 0.5 wt % of chain transfer agent (VIII), about 1 to 4 wt % of the photopolymerization initiator (IX), and about 0.1 to 2 wt % of the metal-containing additive (X).

The physical characteristics of invention formulations can be tailored by proper combination of formulation components. For example, colorloss performance can be optimized by including component (VIII) in addition to required components (I), (V), (VI), and (IX). Likewise, increased toughness is observed for invention formulations containing component (III) in addition to the required components.

In accordance with another aspect of the invention, there are provided printing plates comprising a suitable substrate and a layer of photosensitive resin composition deposited thereupon. To form a printing plate, the photosensitive resin composition is laminated onto a suitable solid substrate. Selected portions of the resin compositions are exposed to actinic radiation, crosslinking said portions. The unexposed portions of the resin composition are washed away in a suitable solvent or dispersant, preferably an aqueous solution, leaving behind the desired image on the printing plate.

A variety of substrates may be used with the photosensitive compositions. The term "substrate" means any solid layer giving support and stability to the photosensitive resin plus an optional adhesion layer. Presently preferred substrates contemplated for use in the practice of the present invention include natural or synthetic materials that can be made into a rigid or flexible sheet form. These materials include steel, copper, or aluminum sheets, plates, or foils, paper, or films or sheets made from synthetic polymeric materials such as polyesters, polystyrene, polyolefins, polyamides, and the like.

The photosensitive resin composition may be deposited onto the substrate in a variety of ways, e.g., by extrusion, roll coating, heat processing, solvent casting, and the like. These techniques can be readily carried out by those skilled in the art.

The desired image is produced on the printing plate by exposing selected portions of the resin to actinic radiation. Selective exposure of the photosensitive resin can be achieved for example, by the use of an image-bearing transparency such as a negative film held in close proximity to the surface of the photosensitive layer, through the front side of the photosensitive resin. Areas of the transparency opaque to actinic radiation prevent the initiation of polymerization within the photosensitive layer directly beneath the transparency. Transparent areas of the image-bearing element will allow the penetration of actinic radiation into the photosensitive layer, initiating polymerization, rendering those areas insoluble or non-dispersible in the processing solvent. Alternatively, exposure of selected portions of the photosensitive layer to laser radiation may also initiate polymerization, rendering those areas insoluble in the processing solvent dispersant. The unexposed portions of the resin are selectively removed by washing in a suitable solvent. Washing may be accomplished by a variety of processes, including brushing, spraying, or immersion.

The invention will now be described in detail by reference to the following non-limiting examples.

EXAMPLE 1 (COMPARATIVE)

The formulations of employed herein are conveniently prepared in two parts as follows: Part A: 7.50 parts of a styrene-isoprene-styrene block copolymer manufactured by Shell Chemical Co., Ltd. (Kraton D 107, a trade name of this company) was pre-dissolved in 6.25 parts of lauryl acrylate manufactured by Sartomer Co. (SR335, a trade name of this company) at 45° C. for one hour.

Part B: 10.00 parts of a polyoxyalkylene mono-phenyl ether manufactured by Dai-Ichi Kogyo Seiyaku Co. Ltd. (PED, a trade name of this company); 5.83 parts of a N,N-dimethyl-4-morpholine ethanamine manufactured by Air Products Inc. (Dabco XDM, a trade name of this company); 6.25 parts of a polyethylene glycol diacrylate manufactured by Sartomer Co. (SR344, a trade name of this company); and 7.50 parts of an ethoxylated trimethylolpropane triacrylate manufactured by Sartomer Co. (SR499, a trade name of this company) were mixed at room temperature, followed by dissolving 0.50 parts of butylated hydroxy toluene manufactured by Sherex Chemical Co. Inc. (Cresol, a trade name of this company); 2.60 parts of 1-hydroxycyclohexyl phenyl ketone manufactured by Ciba Additives (Irgacure-184, a trade name of this company); and 0.51 parts of diphenyl (2,4,6-trimethylbenzyl)phosphine oxide manufactured by BASF Corp. (Lucirim TPO, a trade name of this company).

Resin mixing: 53.06 parts of a particulate copolymer manufactured by JSR Corp., which is an emulsion copolymer of butadiene/methyl methacrylate/methacrylic acid/divinylbenzene=69/20/9/2 (mol %) (TA906, a trade name of this company, see EP 0 607 962 A1, U.S. Pat. No. 6,140, 017); 13.75 parts of Part A; and 33.19 parts of Part B were mixed in a Moriyama mixer at 80° C. (Model D3-7.5 Moriyama MFG. Works, Ltd.). Part B was introduced to the mixer as seven separate aliquots.

Photo-sensitivity evaluation: Using the water-developable photosensitive resin made above, 0.406 mm of the photosensitive resin was extruded on 0.013 mm of emerald color primer coated on 0.165 mm steel metal sheet, for a total thickness of 0.584 mm. The photosensitive plate was pre-exposed under Consolux (Buguess Industries, Inc.) at 90% exposure integration unit (IU) of the maximum pre-exposure IU (i.e., exposure required to render the resin on the plates unremovable) and followed by main exposure on the same instrument under vacuum at sufficient exposure integration units to have 90% shadow open at 120 lpi with a negative film. The imaged plate was then sprayed under NAPP Flex FP-11 processor (NAPP Systems, Inc.) with deionized (DI) water at 135° C., 850 psi; the speed of the processor was set at 28 inch per minute. The results obtained are shown in Table 1.

Physical property evaluation: Two samples of 3.00 mm thick photosensitive resin produced as described above were heat-pressed (Heat Press, Lake Erie Engineering Corp.) in a 8 cm×8 cm model at 70° C. The samples were completely exposed under NAPP Exposure Unit-II on each side for 5 minutes. The exposed samples were tested for hardness (Shore Durometer, Type A-2, the Shore Instrument & MFG. Co.) and resilience (Resilimeter model SR-1, the Shore Instrument & MFG. Co.). A sample of the photosensitive resin with 0.6 mm thickness was heat-pressed at 70° C. The sample was divided into ten 5 cm×1 cm pieces for tensile testing (Instron-5543, Instron Corp.). The results obtained are shown in Table 1.

EXAMPLE 2 (INVENTION)

Part A: 7.00 parts of a styrene-isoprene-styrene block copolymer (Kraton D1107, a trade name of Shell Chemical Co., Ltd.), were pre-dissolved in mixed monomer solvent comprising 4.00 parts of lauryl acrylate (SR 335, a trade name of Sartomer Co.) and 1.50 parts of 1,6-hexanediol dimethacrylate manufactured by Sartomer Co. (SR239, a trade name of this company) at 45° C. for one hour.

Part B: 3.00 parts of a polyoxy alkylene mono-phenyl ether (PED, a trade name of Dai-Ichi Kogyo Seiyaku Co., Ltd.); 5.00 parts of a $C_{12-14}$-t-alkyl ethoxyiated amine manufactured by Union Carbide (RW-100, trade name of this company); 4.50 parts of a N,N-dimethyl-4-morpholine ethanamine (Dabco XDM, a trade name of Air Products Inc.); 4.00 parts of a polyethylene glycol diacrylaze manufactured by Sartomer Co. (SR344, a trade name of this company); 4.00 parts of an ethoxylated penzaerythritol tetraacrylate manufactured by Sartomer Co. (SR494, a trade name of this company); 3.00 parts of a reactive amine manufactured by Sartomer Comp. (CN386, trade name of the company); 3.00 parts of dimethylaminopropyl methacrylamide manufactured by Rohm America (Mhoromer BM-611, a trade name of the company); 2.50 parts of a polyTHF aliphatic urethane diacrylate manufactured by Sartomer Comp. (CN996, a trade name of the company), and 3.50 parts of polybutadiene aliphatic urethane diacrylate manufactured by Sartomer Comp. (CN302, a trade name of the company) were mixed at room temperature. To this mixture was added 0.10 parts of butylated hydroxy toluene (Cresol, a trade name of Sherex Chemical Co., Inc.); 0.20 parts of zinc diacrylate manufactured by Sartomer (SR705, a trade name of the company); 1.20 parts of 1-hydroxycyclohexyl phenyl ketone (Irgacure-184, a trade name of Ciba Additives); 0.40 parts of diphenyl (2,4,6-trimethylbenzyl)phosphine oxide (Lucirim TPO, a trade name of BASF Corp.); and 0.10 parts of trimethyloipropane tri(3-mercaptopropionate) manufactured by Evans Chemitics.

Resin mixing: 53.00 parts of a particulate copolymer (TA906, a trade name of JSR Corp.) which is an emulsion copolymer of butadiene/methyl methacrylate/methacrylic acid/divinylbenzene=69/20/9/2 (mol %); 12.50 parts of Part A; and 34.50 parts of Part B, were mixed in a Moriyama mixer at 80° C. Part B was introduced to the mixer as seven separate aliquots.

Photo-sensitivity evaluation: The methods set forth in Example 1 were used to evaluate the photosensitivity of the formulation prepared according to Example 2. The results obtained are shown in Table 1.

Physical property evaluation: The methods set forth in Example 1 were used to evaluate the photosensitivity of the formulation prepared according to Example 2. The results obtained are shown in Table 1.

EXAMPLE 3 (INVENTION)

Part A: 6.00 parts of a styrene-isoprene-styrene block copolymer Kraton D1107 (a trade name of Shell Chemical Co., Ltd.) and 54.00 parts of a particulate copolymer (TA906 a trade name of JSR Corp.), which is an emulsion copolymer of butadiene/methyl methacrylate/methacrylic acid/divinylbenzene=69/20/9/2 (mol %) were pre-mixed on the heat-press.

Part B: 4.00 parts of Lauryl acrylate (SR335, a trade name of Sartomer Co.); 2.00 parts of 1,6-hexanediol dimethacrylate (SR239, a trade name of Sartomer Co.); 7.00 parts of $C_{12-14}$-t-alkyl ethoxylated amine manufactured by Union Carbide (RW-150, trade name of the company); 3.50 parts of N,N-dimethyl-4-morpholine ethanamine (Dabco XDM, a trade name of Air Products, Inc.); 4.00 parts of polyethylene glycol diacrylate (SR344, a trade name of Sartomer Co.); 4.00 parts of aliphatic tetraacrylate manufactured by Akcros (Actilane 440, a trade name of this company); 3.50 parts of reactive amine (CN386, a trade name of Sartomer Co.); 2.50 parts of dimethylaminopropyl methacrylamide (Mhoromer BM-611, a trade name of Rohm America); 7.50 parts of a polyTHF/polybutadiene=1:1 (wt %) aliphatic urethane diacrylate supplied by Sartomer Company, were mixed at room temperature. To this mixture was added 0.10 parts of butylated hydroxy toluene (Cresol, a trade name of Sherex Chemical Co., Inc.); 0.20 parts of zinc diacrylate (SR705, a trade name of Sartomer Co.); 1.20 parts of 1-hydroxycyclohexyl phenyl ketone (Irgacure-184, a trade name of Ciba Additives); 0.40 parts of diphenyl (2,4,6-trimethylbenzyl) phosphine oxide (Lucirim TPO, a trade name of BASF Corp.); and 0.10 parts of trimethylolpropane tri(3-mercaptopropionate) manufactured by Evans Chemitics.

Resin mixing: 60.00 parts of Part A, 40.00 parts of Part B were mixed on a twin screw mixer (C. W. Brabender Inst. Inc.). Part B was introduced to the mixer as 10 separate aliquots.

Photo-sensitivity evaluation: The methods set forth in Example 1 were used to evaluate the photosensitivity of the formulation prepared according to Example 3. The results obtained are shown in Table 1.

Physical property evaluation: The methods set forth in Example 1 were used to evaluate the photosensitivity of the formulation prepared according to Example 3. The results obtained are shown in Table 1.

EXAMPLE 4 (INVENTION)

Part A: 7.00 parts of a styrene-isoprene-styrene block copolymer (Kraton D1107, a trade name of Shell Chemical Co., Ltd.) and 53.00 parts of a particulate copolymer (TA906, a trade name of JSR Corp.), which is an emulsion copolymer of butadiene/methyl methacrylate/methacrylic acid/divinylbenzene=69/20/9/2 (mol %), were pre-mixed on the heat-press.

Part B: 4.00 parts of lauryl acrylate (SR335, a trade name of Sartomer Co.); 2.00 parts of 1,6-hexanediol dimethacrylate (SR239, a trade name of Sartomer Co.); 7.00 parts of $C_{12-14}$-t-alkyl ethoxylated amine manufactured by Union Carbide (RW-150, trade name of the company); 3.50 parts of N,N-dimethyl-4-morpholine ethanamine (Dabco XDM, a trade name of Air Products, Inc.); 4.00 parts of polyethylene glycol diacrylate (SR344, a trade name of Sartomer Co.); 4.00 parts of aliphatic tetraacrylate (Actilane 440, a trade name of Akcros); 3.50 parts of reactive amine (CN386, a trade name of Sartomer Co.); 2.50 parts of dimethylaminopropyl methacrylamide (Mhoromer BM-611, a trade name of Rohm America); 7.50 parts of a polyTHF/polybutadiene= 2:1 (wt %) aliphatic urethane diacrylate supplied by Sartomer Company, were mixed at room temperature. To this mixture was added 0.10 parts of butylated hydroxy toluene (Cresol, a trade name of Sherex Chemical Co., Inc.); 0.20 parts of zinc diacrylate (SR705, a trade name of Sartomer Co.); 1.20 parts of 1-hydroxycyclohexyl phenyl ketone (Irgacure-184, a trade name of Ciba Additives); 0.40 parts of diphenyl (2,4,6-trimethylbenzyl) phosphine oxide (Lucirim TPO, a trade name of BASF Corp.); and 0.10 parts of trimethylolpropane tri(3-mercaptopropionate) manufactured by Evans Chemitics.

Resin mixing: 60.00 parts of Part A, and 40.00 parts of Part B were mixed on a twin screw mixer. Part B was introduced to the mixer as 10 separate aliquots.

Photo-sensitivity evaluation: The methods set forth in Example 1 were used to evaluate the photosensitivity of the formulation prepared according to Example 4. The results obtained are shown in Table 1.

Physical property evaluation: The methods set forth in Example 1 were used to evaluate the photosensitivity of the formulation prepared according to Example 4. The results obtained are shown in Table 1.

EXAMPLE 5 (INVENTION)

Part A: 7.00 parts of a styrene-isoprene-styrene block copolymer (Kraton D1107, a trade name of Shell Chemical Co., Ltd.), was pre-dissolved in 4.00 parts of lauryl acrylate (SR 335, a trade name of Sartomer Co.); and 1.50 parts of 1,6-hexanediol dimethacrylate (SR239, a trade name of Sartomer Co.), mixed monomer solvent at 45° C. for one hour.

Part B: 3.00 parts of a polyoxy alkylene mono-phenyl ether (PED, a trade name of Dai-Ichi Kogyo Seiyaku Co., Ltd.); 5.00 parts of a $C_{12\text{-}14}$-t-alkyl ethoxylated amine (RW-150, a trade name of Union Carbide); 4.50 parts of a N,N-dimethyl-4-morpholine ethanamine (Dabco XDM, a trade name of Air Products, Inc.); 4.00 parts of a polyethylene glycol diacrylate (SR344, a trade name of Sartomer Co.); 4.00 parts of an aliphatic tetraacrylate (Actilane 440, a trade name of Akcros); 3.00 parts of a reactive amine (CN386, a trade name of Sartomer Co.); 3.00 parts of dimethylaminopropyl methacrylamide (Mhoromer BM-611, a trade name of Rohm America Co.); 2.50 parts of a polyTHF aliphatic urethane diacrylate (CN996, a trade name of Sartomer Co.); and 3.50 parts of [polybutaldiene] polybutadiene aliphatic urethane diacrylate (CN302, a trade name of Sartomer Co.), were mixed at room temperature. To this mixture was added 0.10 parts of butylated hydroxy toluene (Cresol, a trade name of Sherex Chemical Co., Inc.); 0.20 parts of zinc diacrylate (SR705, a trade name of Sartomer Co.); 1.20 parts of 1-hydroxycyclohexyl phenyl ketone (Irgacure-184, a trade name of Ciba Additives); 0.40 parts of diphenyl (2,4,6-trimethylbenzyl) phosphine oxide (Lucirim TPO, a trade name of BASF Corp.); and 0.10 parts of trimethyloipropane tri(3-mercaptopropionate) manufactured by Evans Chemitics.

Resin mixing: 53.00 parts of a particulate copolymer (TA906, a trade name of JSR Corp.), which is an emulsion copolymer of butadiene/methyl methacrylate/methacrylic acid/divinylbenzene=69/20/9/2 (mol %); 12.50 parts of Part A; and 34.50 parts of Part B, were mixed in a Moriyama mixer at 80° C. Part B was introduced to the mixer in seven separate aliquots.

Photo-sensitivity evaluation: The methods set forth in Example 1 were used to evaluate the photosensitivity of the formulation prepared according to the formulation prepared according to Example 5. The results obtained are shown in Table 1.

Physical property evaluation: The methods set forth in Example 1 were used to evaluate the photosensitivity of the formulation prepared according to Example 5. The results obtained are shown in Table 1.

EXAMPLE 6 (INVENTION)

Part A: 7.00 parts of a styrene-isoprene-styrene block copolymer (Kraton D1107, a trade name of Shell Chemical Co., Ltd.) and 52.89 parts of a particulate copolymer (TA906, a trade name of JSR Corp.), which is an emulsion copolymer of butadiene/methyl methacrylate/methacrylic acid/divinylbenzene=69/20/9/2 (mol %), were pre-mixed on the heat-press.

Part B: 7.00 parts of a $C_{12\text{-}14}$-t-alkyl ethoxylated amine (RW-150, a trade name of Union Carbide); 3.52 parts of a N,N-dimethyl-4-morpholine ethanamine (Dabco XDM, a trade name of Air Products Inc.); 4.02 parts of a polyethylene glycol diacrylate (SR344, a trade name of Sartomer Co.); 4.01 parts of lauryl acrylate (SR 335, a trade name of Sartomer Co.); and 2.01 parts of 1,6-hexanediol dimethacrylate (SR239, a trade name of Sartomer Co.); 4.02 parts of an aliphatic tetraacrylate (Actilane 440, a trade name of Akcros); 3.50 parts of a reactive amine (CN386, a trade name of Sartomer Co.); 2.50 parts of dimethylaminopropyl methacrylamide (Mhoromer BM-611, a trade name of Rohm America); 4.01 parts of a polyTHF diacrylate manufactured by Sartomer (Pro-1720, a trade name of the company); and 3.50 parts of polybutadiene aliphatic urethane diacrylale (CN302, a trade name of Sartomer Co.), were mixed at room temperature. To this mixture was added 0.10 parts of butylated hydroxy toluene (Cresol, a trade name of Sherex Chemical Co., Inc.); 0.20 parts of zinc diacrylate (SR705, a trade name of Sartomer Co.); 1.21 parts of 1-hydroxycyclohexyl phenyl ketone (Irgacure-184, a trade name of Ciba Additives); 0.41 parts of diphenyl (2,4,6-trimethylbenzyl) phosphine oxide (Lucirim TPO, a trade name of BASF Corp.); and 0.10 parts of trimethylolpropane tri(3-mercaptopropionate) manufactured by Evans Chemitics.

Resin mixing: 59.89 parts of Part A, and 40.11 parts of Part B were mixed on a twin screw mixer. Part B was introduced to the mixer as 10 separate aliquots.

Photo-sensitivity evaluation: The methods set forth in Example 1 were used to evaluate the photosensitivity of the formulation prepared according to the formulation prepared according to Example 6. The results obtained are shown in Table 1.

Physical property evaluation: The methods set forth in Example 1 were used to evaluate the photosensitivity of the formulation prepared according to Example 6. The results obtained are shown in Table 1.

TABLE 1

| Example | Pre-Exposure (IU) | Main Exposure (IU) | Mini. Dot Holding @ 120 lpi | Color-loss % | Tensile Strength (gf/mm$^2$) | Elongation At Break (%) | Toughness g/mm$^2$ | Impact Resilience (%) | Hardness (Shore A) |
|---|---|---|---|---|---|---|---|---|---|
| 1 (Comparative) | 3.6 | 35 | 3 | 40 | 263 | 62 | 83 | 56 | 68 |
| 2 (Invention) | 4.7 | 30 | 2 | 62 | 409 | 84 | 135 | 37 | 68 |
| 3 (Invention) | 4.9 | 30 | 3 | 40 | 514 | 95 | 229 | 35 | 71 |
| 4 (Invention) | 5.8 | 30 | 3 | 67 | 345 | 63 | 109 | 30 | 76 |
| 5 (Invention) | 4.7 | 30 | 2 | 46 | 409 | 98 | 145 | 34 | 71 |
| 6 (Invention) | 5.2 | 30 | 3 | 27 | 485 | 86 | 160 | 32 | 72 |

As shown above, under typical exposure conditions, invention formulations exhibit superior photosensitivity while providing excellent physical properties.

While the invention has been described in detail with reference to certain preferred embodiments thereof, it will be understood that modifications and variations are within the spirit and scope of that which is described and claimed.

What is claimed is:

1. A high performance, photoimageable resin composition comprising:

(I) in the range of 20 up to about 75 wt % of at least one copolymer comprising:
   (i) 5 up to about 95 mol % of at least one aliphatic conjugated diene monomer,
   (ii) 1 up to about 30 mol % of at least one a α,β-ethylenically unsaturated carboxylic acid, sulfonic acid, phosphonic acid, amine, or ammonium,
   (iii) 0.1 up to about 10 mol % of at least one polyfunctional vinyl monomer,
   (iv) 0 up to about 70 mol % of at least one monofunctional vinyl monomer, and
   (v) 0 up to about 50 mol % of at least one emulsifier per mol of free carboxyl, sulfonyl, phosphonyl, ammonium, or amine, (II) in the range of 5 up to about 35 wt % of a linear thermoplastic, elastomeric polymer of formula B, or block copolymer having at least one unit of the general formula (A-B), (A-B)$_n$, or (A-B-A), wherein A is a non-elastomeric polymer block having a number average molecular weight in the range of about 2,000 to about 100,000 and a glass transition temperature above about 25° C. and B is an elastomeric polymer or polymer block having a number average molecular weight in the range of about 25,000 to about 1,000,000 and glass transition temperature below about 10° C., (III) a (meth)acrylate terminated urethane oligomer having molecular weight from 2000 to about 100,000 having the structure:

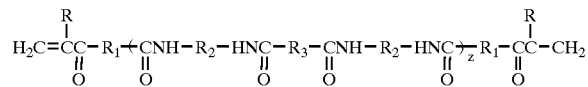

wherein:
each R is independently —H or methyl,
each $R_1$ is independently straight or branched chain lower alkylene, oxyalkylene, alkenylene, and/or oxyalkenylene,
each $R_2$ is independently straight or branched chain alkylene, cycloalkylene, arylene, or alkylarylene,
each $R_3$ is independently straight or branched chain alkylene, oxyalkylene, alkenylene, and/or oxyalkenylene, and
z is 1 to about 100, (IV) at least one monofunctional, ethylenically unsaturated monomer having the structure:

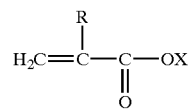

wherein:
R is —H or methyl, and
X is an alkyl group having in the range of about 4 up to about 40 carbon atoms, (V) in the range of 5 to about 25 wt % of at least one polyfunctional, ethylenically unsaturated monomer having the core structure:

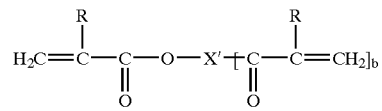

wherein: R is as defined above and X' is selected from:
(i) alkylene or substituted alkylene having in the range of 1 up to about 50 carbon atoms, and b is 1,
(ii) oxyalkylene or substituted oxyalkylene having in the range of 1 up to about 200 carbon atoms, and b is 1,
(iii) a polyvalent alkylene or oxyalkylene moiety, wherein b is 2.3 or 4, and
(iv) a bisphenolyl moiety;

(VI) in the range of 2 to about 35 wt % of a basic nitrogen-containing compound, (VII) in the range of 0 to about 20 wt % of at least one plasticizer having carboxyl, sulfonyl, phosphonyl, ammonium, or amine groups, or alkoxylated derivatives thereof, having from 5 to about 500 carbon atoms, or a mixture of any two or more thereof, (VIII) in the range of 0.05 to about 5 wt % of a chain transfer agent, (IX) in the range of about 0.01 to about 10 wt % of a photopolymerization initiation system, and (X) in the range of 0 to about 5 wt % of a tack reducing agent.

2. The composition according to claim 1, wherein said chain transfer agent (VIII) is a thiol, sulfide, or disulfide.

3. The composition according to claim 2, wherein said chain transfer agent is a thiol.

4. The composition according to claim 3, wherein said thiol is a mono-, di-, tri-, or tetrathiol.

5. The composition according to claim 4, wherein said monothiol is glycerol monothioglycolate, isooctyl 3-mercaptopropionate, or octadecyl 3-mercaptopropionate.

6. The composition according to claim 4, wherein said dithiol is glycol dimercaptopropionate.

7. The composition according to claim 4, wherein said trithiol is irimethylolpropane tri-(3-mercaptopropionate).

8. The composition according to claim 7, wherein said tetrathiol is pentaerythritol tetra-(3-mercaptopropionate).

9. The composition according to claim 2, wherein said chain transfer agent is a sulfide.

10. The composition according to claim 9, wherein said sulfide is dilauryl thiodipropionate or dimethyl thiodipropionate.

11. The composition according to claim 2, wherein said chain transfer agent is a disulfide.

12. The composition according to claim 11, wherein said disulfide is dithio-bis(stearyl propionate).

* * * * *

UNITED STATES PATENT AND TRADEMARK OFFICE
CERTIFICATE OF CORRECTION

PATENT NO. : 6,780,566 B2
DATED : August 24, 2004
INVENTOR(S) : Yuxin Hu et al.

It is certified that error appears in the above-identified patent and that said Letters Patent is hereby corrected as shown below:

Column 1,
Line 9, delete "Mar. 30, 2000" and replace it with -- Mar. 30, 2001 --

Column 19,
Line 4, delete "irimethylolpropane"and replace it with -- trimethylolpropane --

Signed and Sealed this

Thirtieth Day of November, 2004

JON W. DUDAS
*Director of the United States Patent and Trademark Office*